(12) United States Patent
Niebojewski et al.

(10) Patent No.: US 10,790,148 B2
(45) Date of Patent: Sep. 29, 2020

(54) METHOD TO INCREASE EFFECTIVE GATE HEIGHT

(71) Applicant: GLOBALFOUNDRIES INC., Grand Cayman (KY)

(72) Inventors: Heimanu Niebojewski, Cohoes, NY (US); Ruilong Xie, Schenectady, NY (US); Andrew M. Greene, Slingerlands, NY (US)

(73) Assignee: GLOBALFOUNDRIES INC., Grand Caymen (KY)

( * ) Notice: Subject to any disclaimer, the term of this patent is extended or adjusted under 35 U.S.C. 154(b) by 0 days.

(21) Appl. No.: 15/987,018

(22) Filed: May 23, 2018

(65) Prior Publication Data

US 2019/0362978 A1    Nov. 28, 2019

(51) Int. Cl.
*H01L 21/28*  (2006.01)
*H01L 29/06*  (2006.01)
(Continued)

(52) U.S. Cl.
CPC .. *H01L 21/28132* (2013.01); *H01L 21/28088* (2013.01); *H01L 21/28114* (2013.01);
(Continued)

(58) Field of Classification Search
CPC ......... H01L 21/28026; H01L 21/28088; H01L 21/28114; H01L 21/28132;
(Continued)

(56) References Cited

U.S. PATENT DOCUMENTS 9,129,986 B2    9/2015  Zang et al.
2003/0030103 A1*  2/2003  Ryu ................... H01L 21/26586
                                    257/331
(Continued)

FOREIGN PATENT DOCUMENTS

TW         201711194 A       3/2017

OTHER PUBLICATIONS

Kolari, K., "High Etch Selectivity for Plasma Etching SiO2 and AlN and Al2O3 Masks"; Microelectronic Engineering; vol. 85, Issues 5-6, May-Jun. 2008, pp. 985-987.
(Continued)

*Primary Examiner* — David C Spalla
(74) *Attorney, Agent, or Firm* — Francois Pagette; Hoffman Warnick LLC

(57) ABSTRACT

A method of manufacturing a semiconductor device includes forming a composite spacer architecture over sidewalls of a sacrificial gate disposed over a semiconductor layer, and the subsequent deposition of a supplemental sacrificial gate over the sacrificial gate. A recess etch of the composite spacer architecture is followed by the formation within the recess of a sacrificial capping layer. The supplemental sacrificial gate and the sacrificial gate are removed to expose the composite spacer architecture, which is selectively etched to form a T-shaped cavity overlying a channel region of the semiconductor layer. A replacement metal gate is formed within a lower region of the T-shaped cavity, and a self-aligned contact (SAC) capping layer is formed within an upper region of the T-shaped cavity prior to metallization of the device.

20 Claims, 16 Drawing Sheets

(51) Int. Cl.
*H01L 29/423* (2006.01)
*H01L 29/49* (2006.01)
*H01L 29/66* (2006.01)
*H01L 29/78* (2006.01)

(52) U.S. Cl.
CPC .... *H01L 29/0653* (2013.01); *H01L 29/42372* (2013.01); *H01L 29/4966* (2013.01); *H01L 29/6653* (2013.01); *H01L 29/66545* (2013.01); *H01L 29/66795* (2013.01); *H01L 29/785* (2013.01)

(58) Field of Classification Search
CPC ......... H01L 29/42372; H01L 29/42376; H01L 29/4966; H01L 29/55795; H01L 29/6653; H01L 29/66545; H01L 29/785
See application file for complete search history.

(56) References Cited

U.S. PATENT DOCUMENTS

| | | |
|---|---|---|
| 2011/0062501 A1 | 3/2011 | Soss et al. |
| 2011/0298061 A1 | 12/2011 | Siddiqui et al. |
| 2013/0187203 A1 | 7/2013 | Xie et al. |
| 2016/0043186 A1* | 2/2016 | Liu .................. H01L 21/76834 257/401 |
| 2017/0110549 A1* | 4/2017 | Xie .................. H01L 29/41766 |
| 2018/0211874 A1* | 7/2018 | Basker .............. H01L 21/28088 |

OTHER PUBLICATIONS

TW Office Action and Search Report for corresponding Taiwan Patent Application No. 10821143730 dated Dec. 5, 2019, 12 pages.

* cited by examiner

METHOD TO INCREASE EFFECTIVE GATE HEIGHT

BACKGROUND

The present application relates generally to methods for forming semiconductor devices, and more specifically to methods for forming devices such as fin field effect transistors (FinFETs) having a reduced risk of electrical shorts between gate and source/drain contacts.

A trend in the development of semiconductor manufacturing technologies has been to increase the density of devices per chip, and hence decrease the size of active structures as well as the distances between such structures. An increase in device density may advantageously affect device performance such as circuit speed, and may allow also for increasingly complex designs and functionality. However, the decrease in size and the attendant increase in density may also generate undesirable effects, including unwanted short circuits between adjacent conductive elements.

In advanced node FinFET devices, for instance, the proximity of gate contacts and source/drain contacts may lead to unwanted parasitic capacitance or conduction, i.e., leakage, between these adjacent structures, particularly at the respective top and bottom portions of the structures, which can adversely affect performance and yield.

SUMMARY

It is therefore desirable to develop semiconductor device architectures and methods for fabricating semiconductor device architectures that have a decreased propensity for unwanted short circuits or parasitic capacitance between adjacent conductive elements, such as between adjacent gate and source/drain contacts.

In accordance with various embodiments, the formation of a semiconductor device includes the formation of a supplemental sacrificial gate that extends the height of a sacrificial gate and enables the formation of an improved gate cap, which provides an effective gate-to-source/drain dielectric barrier. In certain embodiments, the enhanced sacrificial gate height enables the formation of a thicker T-shaped gate cap as well as a thicker cap over source/drain contacts.

An exemplary device includes a layer of semiconductor material having a source/drain region and a channel region adjacent to the source/drain region, a conductive contact disposed over the source/drain region, a gate stack disposed over the channel region, and a capping layer disposed over the gate stack, where the gate cap has a lower portion having a first width, an upper portion having a second width greater than the first width, and the lower portion and the upper portion have substantially vertical sidewalls. The semiconductor layer may include a layer of an SOI substrate, or a portion of a semiconductor fin formed over a substrate.

A further device includes a semiconductor layer having a source/drain region and a channel region adjacent to the source/drain region, a conductive contact disposed over the source/drain region, a gate stack disposed over the channel region, a gate cap disposed over the gate stack, where the gate cap has a lower portion having a first width, an upper portion having a second width greater than the first width, and a low-k spacer layer disposed between the conductive contact and the lower portion of the gate cap.

According to various embodiments, a method of forming a semiconductor device includes forming a semiconductor layer over a semiconductor substrate, where the semiconductor layer has a source/drain region and a channel region adjacent to the source/drain region, forming a sacrificial gate over the channel region of the semiconductor layer, and forming a hard mask over the sacrificial gate.

A first spacer layer is deposited over sidewalls of the sacrificial gate and over sidewalls of the hard mask, and a second spacer layer is deposited over sidewalls of the first spacer layer. Thereafter, the hard mask and portions of the first spacer layer are removed to form an opening over the sacrificial gate, and a supplemental sacrificial gate is formed within the opening.

The method further includes etching the second spacer layer to form a recess, forming a sacrificial capping layer within the recess, removing the supplemental sacrificial gate and the sacrificial gate to form a gate opening, removing the second spacer layer from upper sidewalls of the gate opening above the first spacer layer, forming a functional gate within the gate opening over the channel region of the semiconductor layer, and forming a gate cap within the gate opening over the functional gate.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
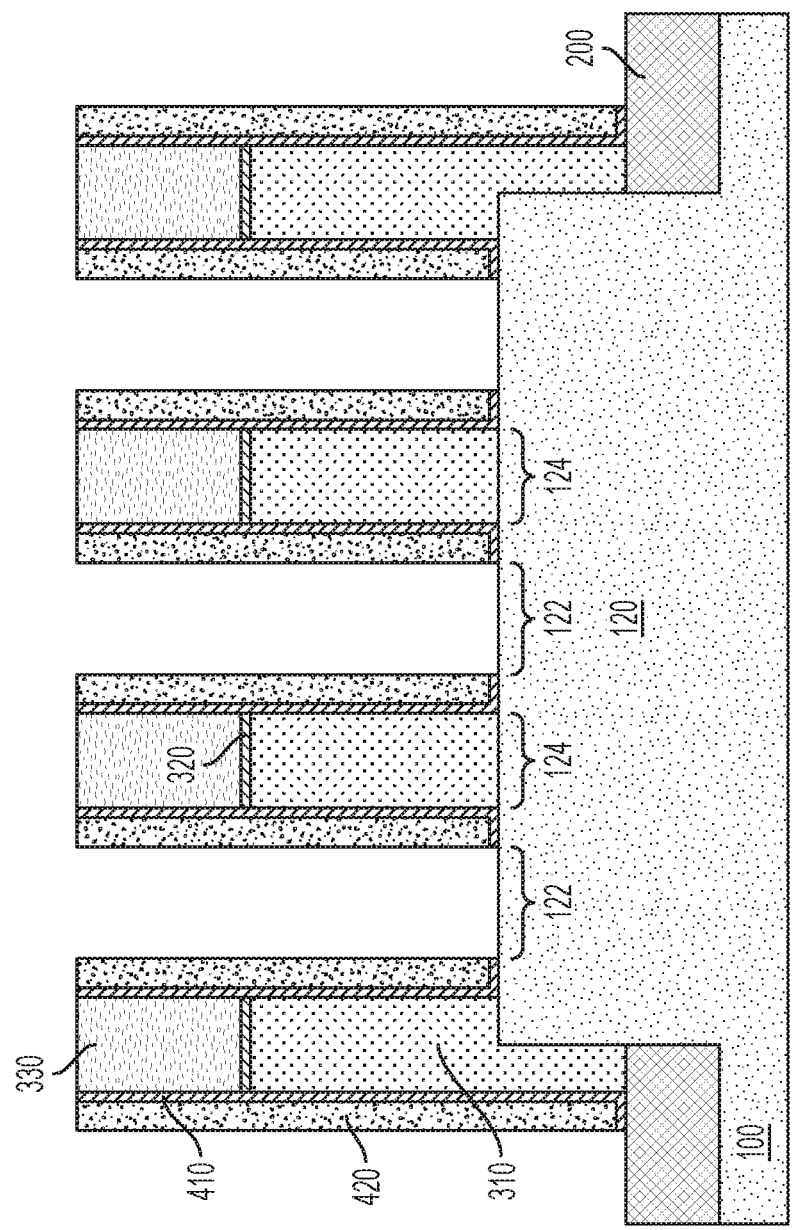
FIG. 1 is a schematic cross-sectional diagram of a FinFET device at an intermediate stage of fabrication including a semiconductor fin having alternating source/drain and channel regions, a sacrificial gate and a sacrificial gate hard mask disposed over the channel regions of the fin, and a composite spacer layer disposed over sidewalls of the sacrificial gate and the sacrificial gate hard mask.

Reference will now be made in greater detail to various embodiments of the subject matter of the present application, some embodiments of which are illustrated in the accompanying drawings. The same reference numerals will be used throughout the drawings to refer to the same or similar parts.

As used herein, the formation or deposition of a layer or structure may involve one or more techniques suitable for the material or layer being deposited or the structure being formed. Such techniques include, but are not limited to, chemical vapor deposition (CVD), low-pressure chemical vapor deposition (LPCVD), plasma enhanced chemical vapor deposition (PECVD), metal organic CVD (MOCVD), atomic layer deposition (ALD), molecular beam epitaxy (MBE), electroplating, electroless plating, ion beam deposition, and physical vapor deposition (PVD) techniques such as sputtering or evaporation.

Disclosed in various embodiments is a method of manufacturing a semiconductor device such as a FinFET (3D) device where a composite spacer architecture is formed over sidewalls of a sacrificial gate, and the subsequent deposition of a supplemental sacrificial gate over the sacrificial gate enables the composite spacer topology to be maintained prior to a recess etch thereof and the formation within the recess of a sacrificial capping layer. Removal of the supplemental sacrificial gate and the sacrificial gate re-exposes the composite spacer architecture, which is selectively etched to form a T-shaped cavity overlying a channel region of the fin. A replacement metal gate is formed within a lower region of the T-shaped cavity, and a self-aligned contact (SAC) capping layer is formed within an upper region of the T-shaped cavity prior to metallization of the replacement metal gate and source/drain regions of the device. In various embodiments, the self-aligned contact (SAC) capping layer is T-shaped. As used herein, a "T-shaped" structure such as a T-shaped cavity or a T-shaped capping layer has an upper region and a lower region, where the upper region is wider than the lower region, and the upper region extends laterally beyond each of at least one pair of opposing sidewalls of the lower region.

The formation of a T-shaped self-aligned contact (SAC) capping layer, which provides an effective barrier between adjacent conductive structures, as well as the use of a supplemental sacrificial gate to form the T-shaped capping layer, is described in connection with a FinFET device architecture in FIGS. 1-11. An abbreviated process flow for forming a T-shaped self-aligned contact capping layer for a planar device is described with reference to FIGS. 12-16.

Referring to FIG. 1, a FinFET structure at an intermediate stage of fabrication includes a semiconductor fin 120 formed over a semiconductor substrate 100. The semiconductor substrate 100 may be a bulk substrate or a composite substrate such as a semiconductor-on-insulator (SOI) substrate, and may include any suitable semiconductor material as known to those skilled in the art. Portions of the semiconductor substrate may be amorphous, polycrystalline, or single crystalline. Although a single fin 120 is shown in the illustrated cross-section, it will be appreciated that an array of fins 120 may be formed over the substrate 100.

In various embodiments, each fin 120 includes a semiconductor material such as silicon, and may be formed by patterning and then etching the semiconductor substrate 100, e.g., a top portion of the semiconductor substrate. In several embodiments, a fin 120 is etched from, and is therefore contiguous with the semiconductor substrate. For instance, fin 120 may be formed using a sidewall image transfer (SIT) process as known to those skilled in the art.

Each fin 120 can include a single crystal semiconductor material that extends along a lengthwise direction. As used herein, a "lengthwise direction" is a horizontal direction along with an object extends the most. A "widthwise direction" is a horizontal direction that is perpendicular to the lengthwise direction.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

In certain embodiments, the fins 120 can have a width of 5 nm to 20 nm, and a height of 40 nm to 150 nm, although other dimensions are also contemplated. In structures including plural fins, i.e., a fin array, each fin may be spaced apart from its nearest neighbor by a periodicity or pitch (d) of 20 nm to 100 nm, e.g., 20, 30, 40, 50, 60, 70, 80, 90 or 100 nm, including ranges between any of the foregoing values. As used herein, the term "pitch" refers to the sum of the fin width and the spacing between neighboring fins.

Such plural fins are typically oriented parallel to each other and perpendicular to the library logic flow of a circuit. After fin formation, a fin cut or fin removal process may be used to eliminate unwanted fins or unwanted portions thereof for the particular circuit or device being fabricated. Thus, the fin-to-fin periodicity may be constant or variable over an array of fins.

The fin 120 includes alternating source/drain regions 122 and channel regions 124 as will be appreciated by those skilled in the art. A shallow trench isolation (STI) layer 200 may be used to provide electrical isolation between the fins 120 and between adjacent devices as is needed for the circuit(s) being formed. An STI process for FinFET devices involves creating isolation trenches in the semiconductor substrate 100 through an anisotropic etch process. The isolation trench between each adjacent fin may have a relatively low aspect ratio (e.g., ratio of the depth of the isolation trench to its width). According to certain embodiments, a dielectric filler material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. The planarized oxide is then etched back to form a recessed, uniformly thick oxide isolation layer 200 between the fins 120, where upper sidewalls of the fins 120 can be exposed for further processing.

"Planarization" and "planarize" as used herein refer to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Referring still to FIG. 1, the structure includes a sacrificial gate 310 formed over each channel region 124 of fin 120. According to various embodiments, a sacrificial gate oxide layer 320 is formed over the sacrificial gate 310, and a sacrificial gate hard mask 330 is formed over the sacrificial gate oxide layer 320.

The sacrificial gate 310 may be formed using conventional deposition, photolithography and etching processes. The sacrificial gate 310 may include a layer of amorphous silicon (a-Si) or polycrystalline silicon, for example. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition.

The sacrificial gate 310 extends over the top surface and sidewall surfaces of the fin 120 and may have a thickness sufficient to completely cover the fin. For instance, a thickness of sacrificial gate 310 may range from 50 to 200 nm, e.g., 50, 75, 100, 125, 150, 175 or 200 nm, including ranges between any of the foregoing values, although lesser and greater thicknesses may be used.

In certain embodiments, a sacrificial gate 310 may be formed from a blanket sacrificial gate layer that is deposited over the fins. Sacrificial gate oxide layer 320 and hard mask 330 are formed in succession over the sacrificial gate layer and patterned, for example, using conventional photolithography and etching techniques. The hard mask 330 may include a dielectric material such as silicon nitride, and may be formed using chemical vapor deposition. An example hard mask 330 has a thickness of 20 to 30 nm.

According to various embodiments, the sacrificial gate 310, sacrificial gate oxide layer 320 and hard mask 330 template the formation of a first spacer layer 410 is over sidewalls thereof, and a second spacer layer 420 over sidewalls of the first spacer layer 410. First and second spacer layers 410, 420 may be formed by blanket deposition of a spacer material (e.g., using atomic layer deposition) followed by a directional etch such as reactive ion etching (RIE) to remove the spacer materials from horizontal surfaces. Suitable materials for first spacer layer 410 include oxides, nitrides and oxynitrides, such as silicon dioxide, silicon nitride, silicon oxynitride, and low dielectric constant (low-k) materials such as amorphous carbon, SiOC, SiCN, SiOCN and SiBCN. As used herein, a "low-k" material has a dielectric constant less than that of silicon dioxide. In certain embodiments, the thickness of the first spacer layer 410 may be 2 to 5 nm, e.g., 2, 3, 4, or 5 nm, including ranges between any of the foregoing values.

As will be appreciated, the compounds silicon dioxide and silicon nitride have compositions that are nominally represented as $SiO_2$ and $Si_3N_4$, respectively. The terms silicon dioxide and silicon nitride, refer to not only these stoichiometric compositions, but also to oxide and nitride compositions that deviate from the stoichiometric compositions.

A second spacer layer 420 is formed over the first spacer layer 410. According to various embodiments, the methods and materials used to form first spacer layer 410 may be used to form second spacer layer 420. In certain embodiments, the thickness of the second spacer layer 420 may be 5 to 10 nm, e.g., 5, 8 or 10 nm, including ranges between any of the foregoing values.

According to certain embodiments, the first and second spacer layer materials are etch selective with respect to silicon dioxide and amorphous silicon. In an example structure, the first spacer layer 410 includes silicon nitride and the second spacer layer 420 includes a low-k material.

In an example structure, one or both of the first and second spacer layers 410, 420 may have a dielectric constant less than that of silicon dioxide. By way of example, first spacer layer 410 and second spacer layer 420 may independently have a dielectric constant of 2.8 to 3.8, e.g., 2.8, 3.0, 3.2, 3.4, 3.6 or 3.8, including ranges between any of the foregoing values.

Figure 2:
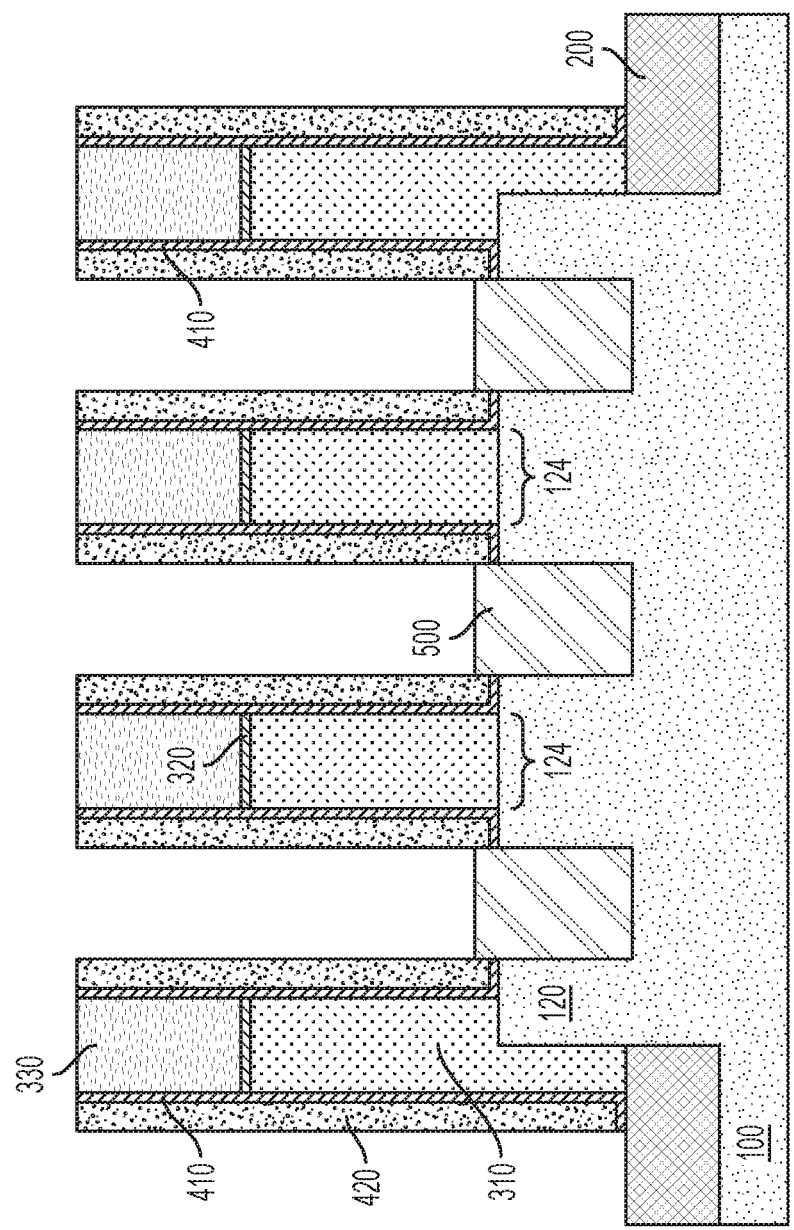
FIG. 2 shows a cross-section of the FinFET device of FIG. 1 after the formation of epitaxial source/drain junctions over the source/drain regions of the fin.

Referring to FIG. 2, source/drain junctions 500 are formed over source/drain regions 122 of fin 120. Source/drain junctions 500 may be formed by ion implantation or selective epitaxy following formation of the sacrificial gate 310 and spacer layers 410, 420, e.g., using the spacer layers 410, 420 as an alignment mask.

According to various embodiments, source/drain junctions 500 may include silicon (e.g., Si) or a silicon-containing material such as silicon germanium (SiGe). For instance, SiGe source/drain junctions may be incorporated into a p-MOS device to provide compressive stress to the channel, which can improve carrier mobility.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Example epitaxial growth processes include low energy plasma deposition, liquid phase epitaxy, molecular beam epitaxy, and atmospheric pressure chemical vapor deposition.

The source/drain junctions 500 may be doped, which may be performed in situ, i.e., during epitaxial growth, or following epitaxial growth, for example, using ion implantation or plasma doping. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

An optional drive-in anneal can be used to diffuse dopant species and generate a desired dopant profile. In certain embodiments, dopant atoms within the source/drain junctions 500 may be diffused into the semiconductor fin 120 using a post-epitaxy or post-implantation anneal (e.g., at a temperature of 600° C. to 1400° C.) to create a desired dopant profile within the fin.

Figure 3:
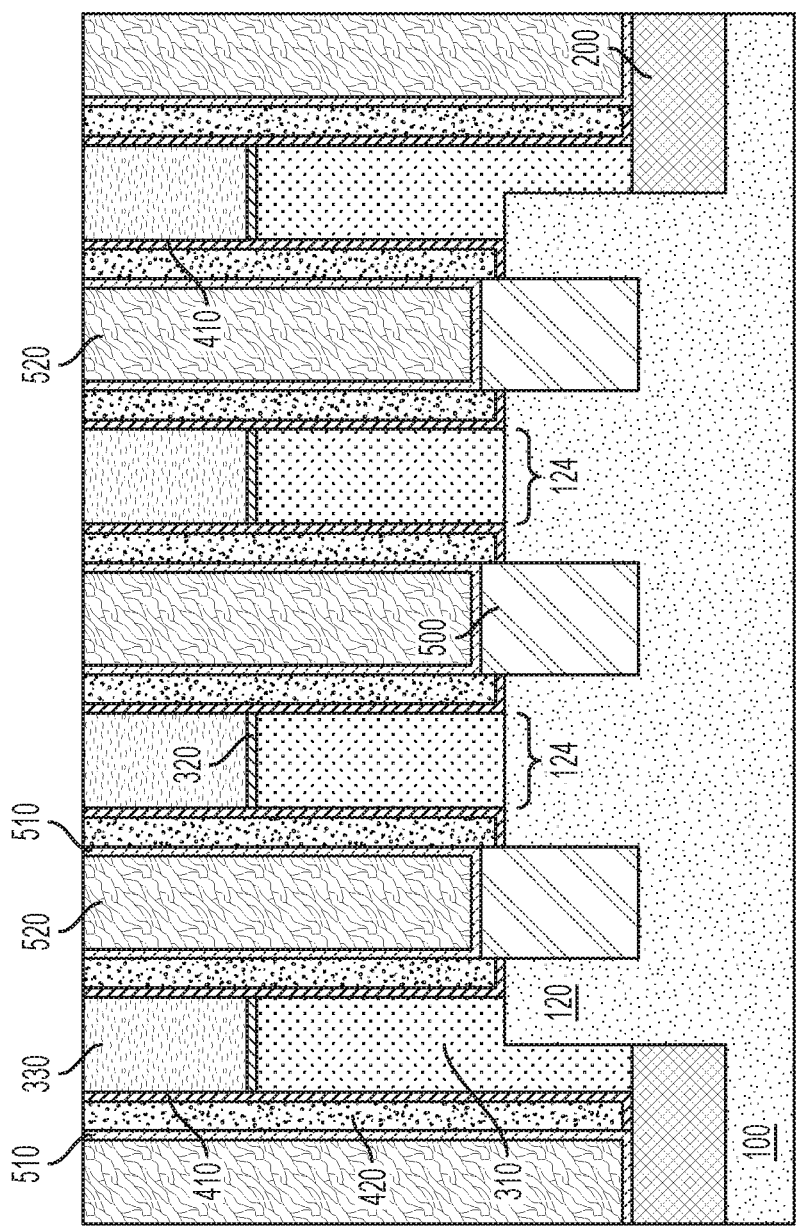
FIG. 3 shows the formation of a conformal contact etch stop layer within contact locations over the source/drain junctions and a dielectric fill layer over the contact etch stop layer.

Referring to FIG. 3, a conformal liner 510 is formed within contact locations over the source/drain junctions 500, and a dielectric fill layer 520 is formed directly over the conformal liner 510. The conformal liner 510 is adapted to function as a contact etch stop layer (CESL). As will be appreciated, conformal liner 510 and dielectric fill layer 520 extend over non-contact locations between fins, i.e., over STI layer 200.

Conformal liner 510 may be formed by blanket deposition of a suitable contact etch stop material (e.g., using atomic layer deposition). In certain embodiments, the conformal liner 510 thickness is 2 to 10 nm, e.g., 2, 4, 6, 8 or 10 nm, including ranges between any of the foregoing values.

In various embodiments, the second spacer layer 420 and the conformal liner 510 are formed from materials that can be etched selectively to one another. In particular embodiments, the second spacer layer 420 includes SiOC or SiOCN and the conformal liner (i.e., contact etch stop layer) 510 includes silicon nitride.

The dielectric fill layer 520 may include any dielectric material including, for example, oxides, nitrides or oxynitrides. In one embodiment, the dielectric fill layer 520 includes silicon dioxide. By way of example, dielectric fill layer 520 may be a composite layer that includes an initially-deposited flowable oxide (FOX) layer, i.e., a flowable oxide layer deposited directly over the conformal liner 510, and a high density plasma (HDP) oxide gap fill layer deposited over the flowable oxide layer. In various embodiments, the dielectric fill layer 520 may be self-planarizing, or the top surface of the dielectric fill layer 520 can be planarized by chemical mechanical polishing (CMP).

Figure 4:
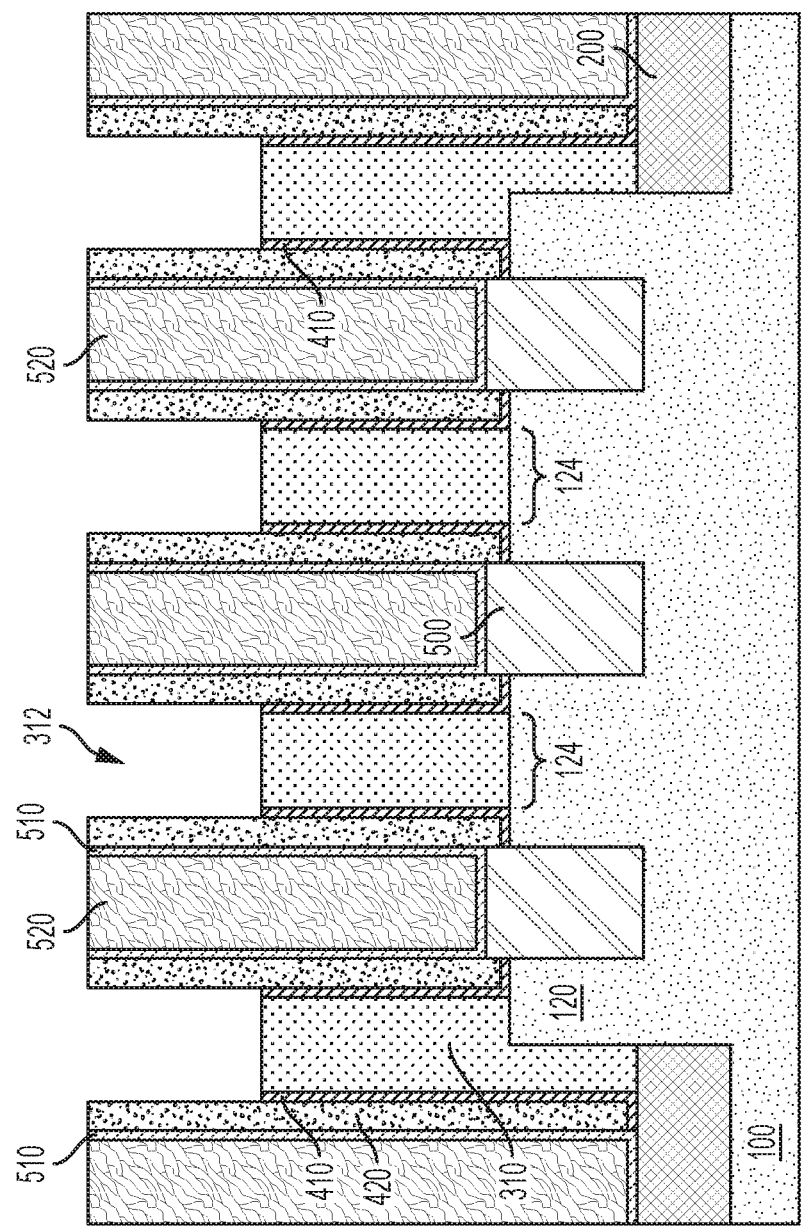
FIG. 4 depicts removal of the sacrificial gate hard mask from over the sacrificial gate.

Referring to FIG. 4, a selective etch is used to remove the hard mask 330 and the sacrificial gate oxide layer 320 from over the sacrificial gate 310 to form openings 312. The selective etch also removes exposed portions of the first spacer layer 410 above the sacrificial gate 310. As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

Figure 5:
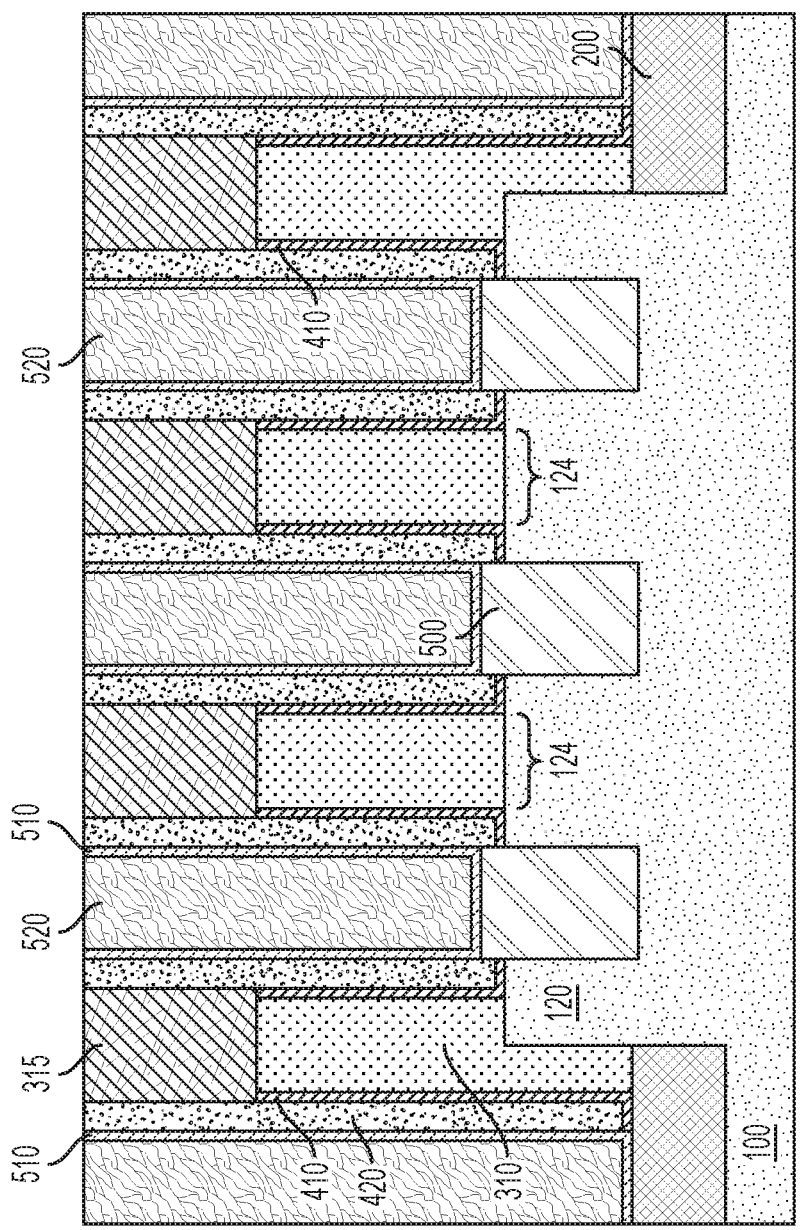
FIG. 5 depicts the formation of a supplemental sacrificial gate over the sacrificial gate.

Referring to FIG. 5, a supplemental sacrificial gate 315 is formed within each opening 312 directly over sacrificial gate 310. The supplemental sacrificial gate 315 may include a layer of amorphous silicon (a-Si) or polycrystalline silicon. As seen with reference to FIG. 5, sacrificial gate 310 is disposed directly over sidewalls of the first spacer layer 410, while supplemental sacrificial gate 315 is formed within opening 312 directly over sidewalls of the second spacer layer 420.

Figure 6:
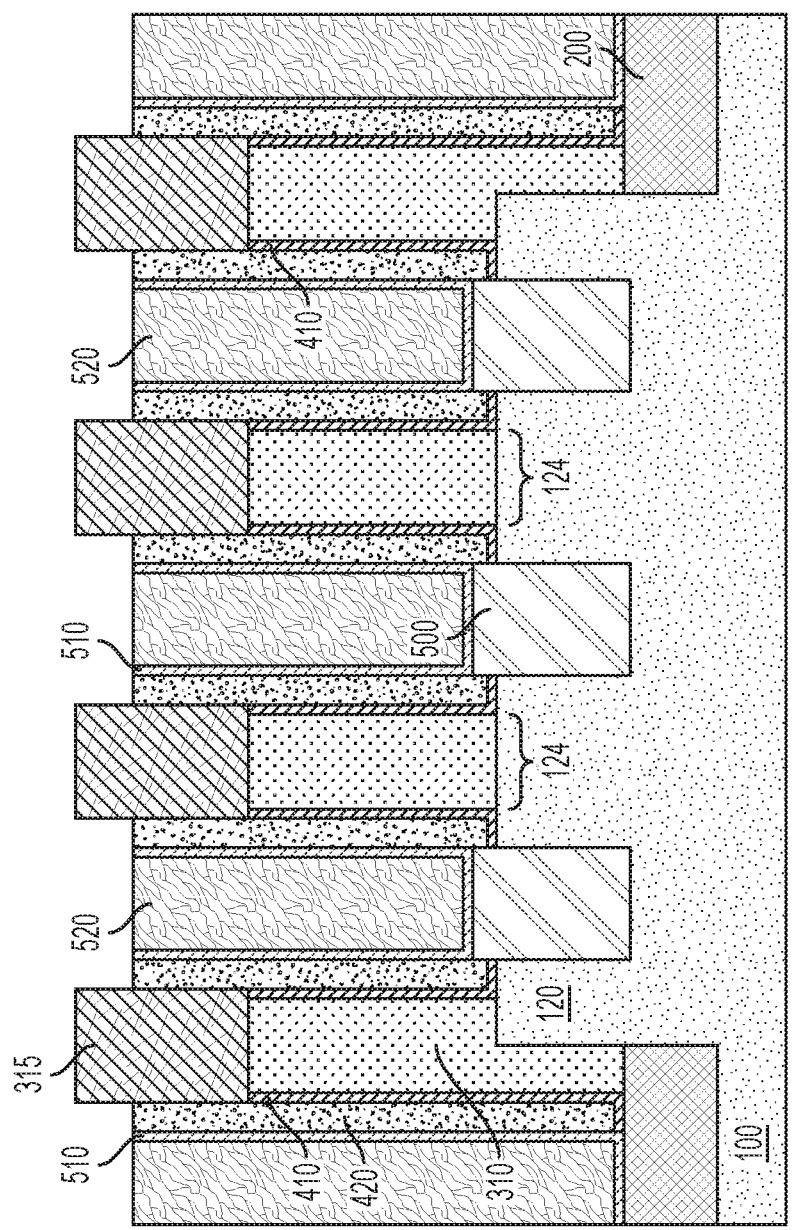
FIG. 6 shows a recess etch of a sidewall spacer layer, the contact etch stop layer and the dielectric fill layer between adjacent sacrificial gates.

Referring to FIG. 6, a further selective etching step is used to recess the second spacer layer 420, conformal liner 510 and dielectric fill layer 520 with respect to the supplemental sacrificial gate 315. The recess etch exposes sidewalls of the supplemental sacrificial gate 315 without exposing the first spacer layer 410 or the sacrificial gate 310. Dielectric layers 420, 510 and 520 may be recessed using a reactive ion etching (RIE) process.

Figure 7:
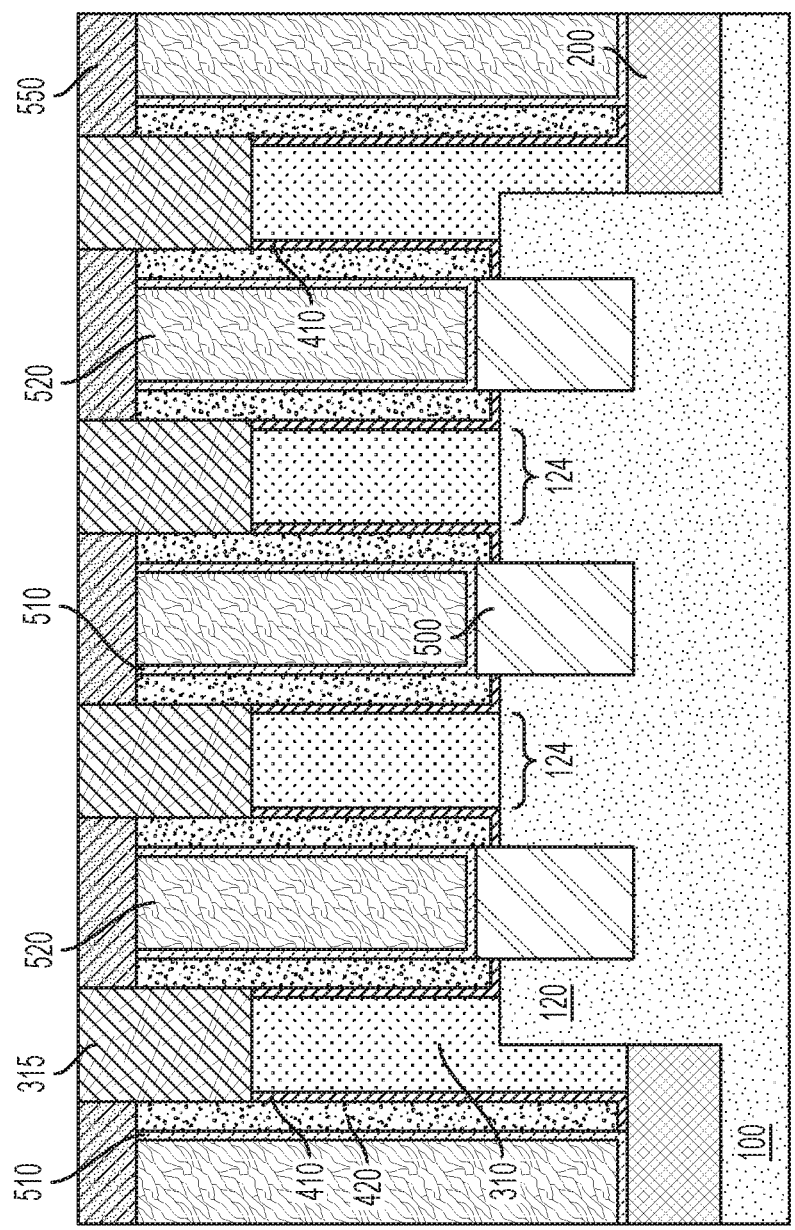
FIG. 7 depicts the formation of a sacrificial capping layer over the recessed architecture of FIG. 6.

Referring to FIG. 7, a sacrificial capping layer 550 is formed by depositing a dielectric material into the recesses, such that a bottom surface of the sacrificial capping layer 550 is disposed above a top surface of the sacrificial gate 310. A polishing step may be used to remove the overburden and expose a top surface of the supplemental sacrificial gate 315, e.g., using the supplemental sacrificial gate 315 as an etch stop layer. Sacrificial capping layer 550 may include silicon nitride or silicon dioxide, for example.

Figure 8:
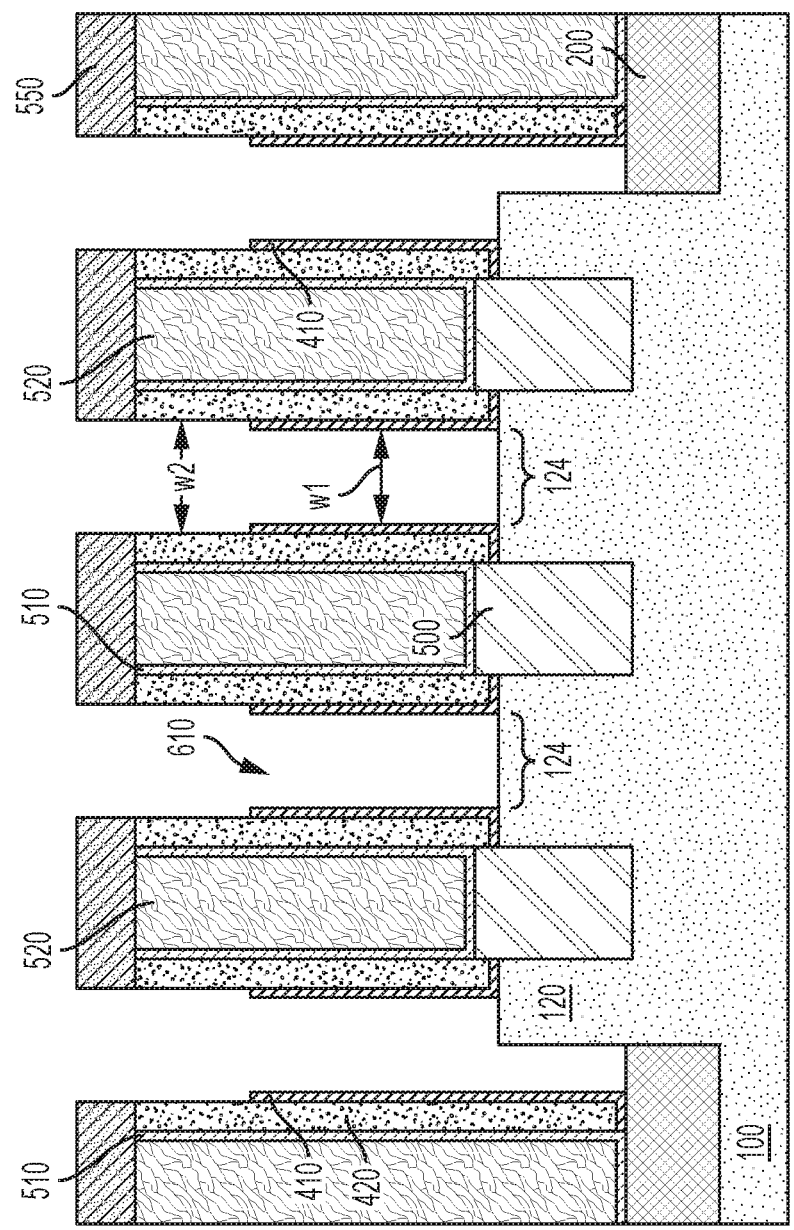
FIG. 8 shows the selective removal of the supplemental sacrificial gate and the sacrificial gate.

Referring to FIG. 8, the supplemental sacrificial gate 315 and the sacrificial gate 310 are etched selectively with respect to sacrificial capping layer 550, first spacer layer 410 and second spacer layer 420 to form gate openings 610 and expose channel regions 124 of fin 120. Within an upper region of the gate openings 610, sidewalls thereof are defined by the second spacer layer 420, while within a lower region of the gate openings 610, sidewalls thereof are defined by first spacer layer 410. Thus, at this stage of processing, a width (w1) of a lower region of the gate opening 610 is less than a width (w2) of an upper region of the gate opening 610. In certain embodiments, the width (w1) may range from 10 to 40 nm, e.g., 10, 15, 20, 25, 30, 35 or 40 nm, including ranges between any of the foregoing values, and the width (w2) may range from 14 to 50 nm, e.g., 15, 20, 30, 40 or 50 nm, including ranges between any of the foregoing values.

Figure 9:
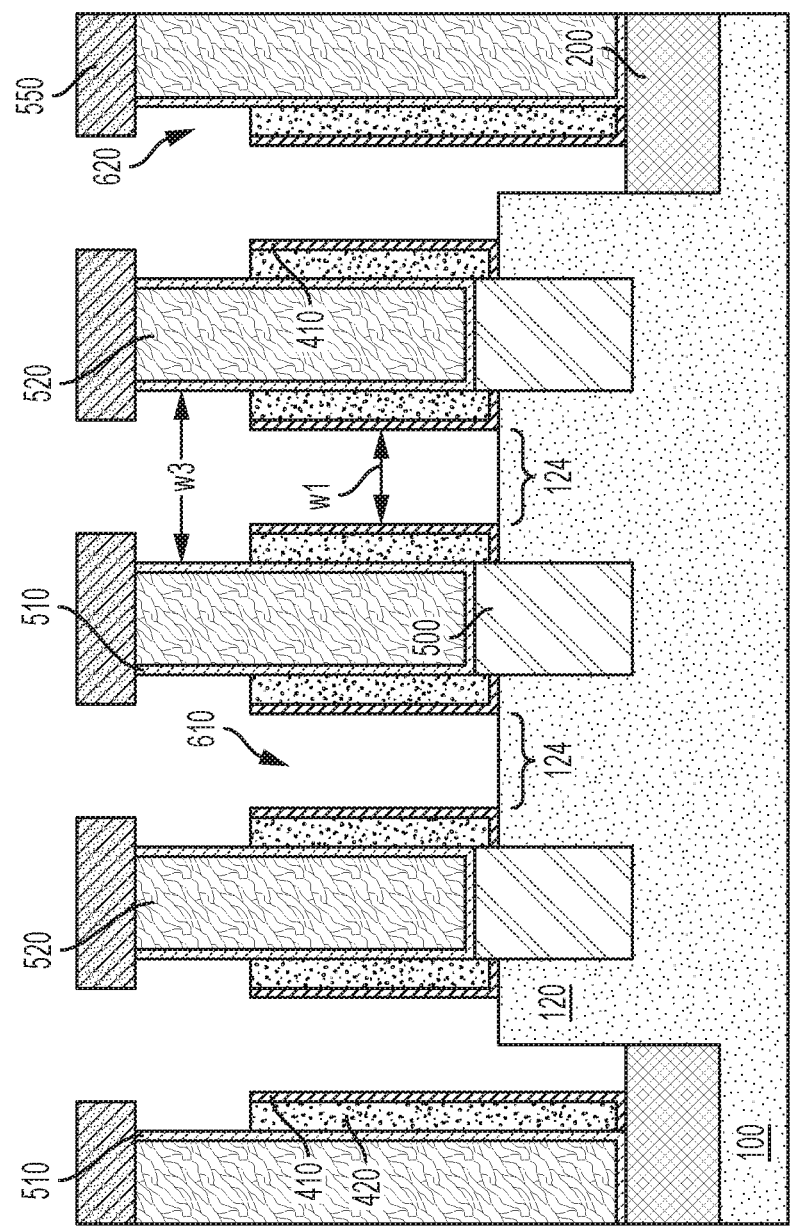
FIG. 9 shows the FinFET device structure following partial removal of the sidewall spacer layer from under the sacrificial capping layer.

As seen with reference to FIG. 9, a further etching step is used to remove the second spacer layer 420 proximate to the upper region of the gate opening 610. Following the selective etch of the second spacer layer 420, the upper region of the gate opening 610 has a width (w3), where sidewalls of the upper region of the gate opening are now defined by conformal liner 510. According to certain embodiments, width (w3) may range from 20 to 70 nm, e.g., 20, 30, 40, 50, 60 or 70 nm, including ranges between any of the foregoing values.

Figure 10:
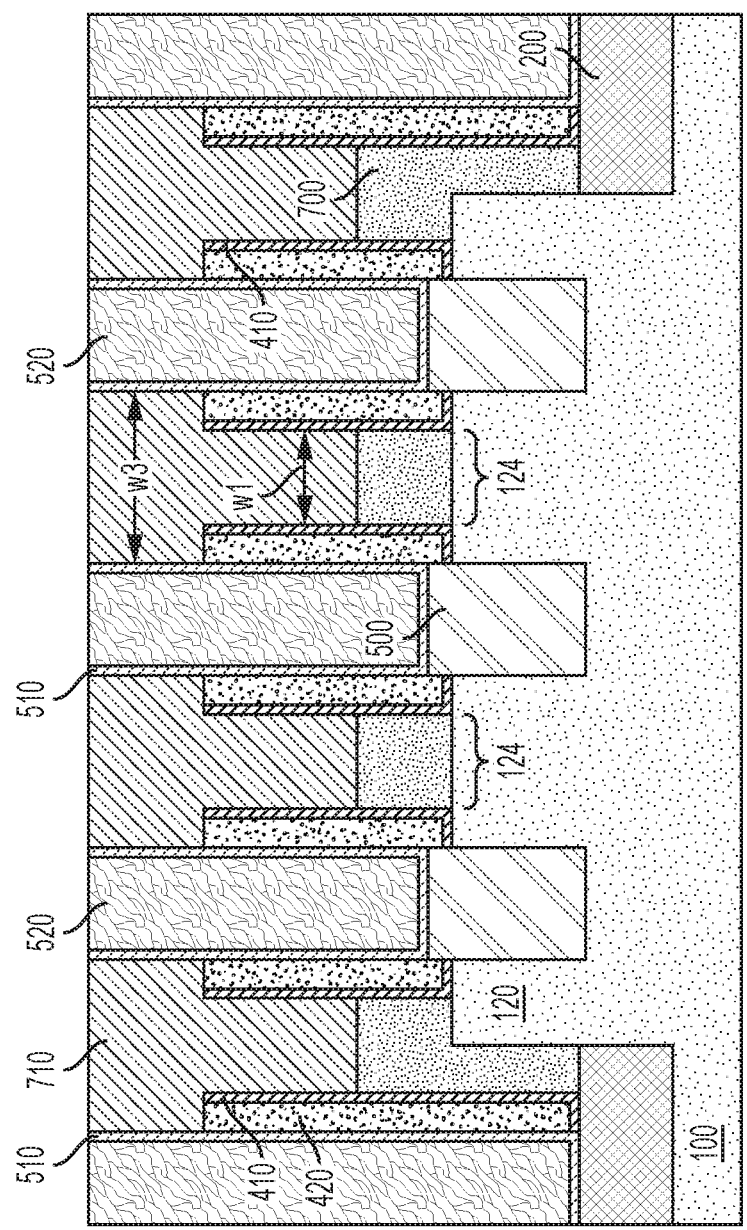
FIG. 10 depicts the FinFET device structure following a replacement metal gate module and the deposition and planarization of a self-aligned gate cap over functional gates.

Referring to FIG. 10, a replacement metal gate (RMG) module is used to form a functional gate stack 700 over channel regions 124 of the fin 120. The functional gate stack 700 includes a gate dielectric and an overlying gate conductor (not separately shown).

As used herein, a "functional gate" or "gate" refers to a structure used to control output current (i.e., the flow of carriers through a channel) of a semiconductor device using an electrical field or, in some instances, a magnetic field, and includes a gate dielectric and a gate conductor.

The gate dielectric may include silicon dioxide, silicon nitride, silicon oxynitride, a high-k dielectric, or other suitable material. As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The gate dielectric thickness may range from 1 nm to 10 nm, e.g., 1, 2, 4, 6, 8 or 10 nm, including ranges between any of the foregoing.

The gate conductor may include a conductive material such as polysilicon, silicon-germanium, a conductive metal such as Al, W, Cu, Ti, Ta, W, Co, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof. The gate conductor may include one or more layers of such materials such as, for example, a metal stack including a work function metal layer and/or a conductive liner, and may have a thickness of 20 to 40 nm. In certain embodiments, the gate conductor includes a titanium nitride (TiN) layer directly over the gate dielectric and a tungsten (W) or cobalt (Co) fill layer over the titanium nitride layer.

Prior to forming gate stack 700, an etching step may be used to remove native oxide and an extended gate (EG) oxide from over the channel regions 124 of the fins 120. In certain embodiments, a single etching step may be used to strip native oxide and an EG oxide, if present, and laterally etch second spacer layer 620.

Referring still to FIG. 10, a self-aligned gate cap 710 is formed directly over the gate stack 700. Following deposition of the gate cap material, a polishing step may be used to remove the overburden and form a planarized structure. In certain embodiments, the polishing step removes the sacrificial capping layer 550. By way of example, the gate cap 710 may include a nitride material such as silicon nitride or silicon oxynitride (SiON).

In the illustrated embodiment, a sidewall surface of an upper portion of the gate cap 710 directly contacts conformal liner 510, while a sidewall surface of a lower portion of the gate cap 710 directly contacts first spacer layer 410. The gate cap 710 thus has a T-shape. In various embodiments, within both the upper portion and the lower portion, the gate cap 710 has substantially vertical sidewalls. As used herein, "substantially vertical" sidewalls deviate from a direction normal to a major surface of the substrate by less than 5°, e.g., 0, 1, 2, 3, 4, or 5°, including ranges between any of the foregoing values.

Figure 11:
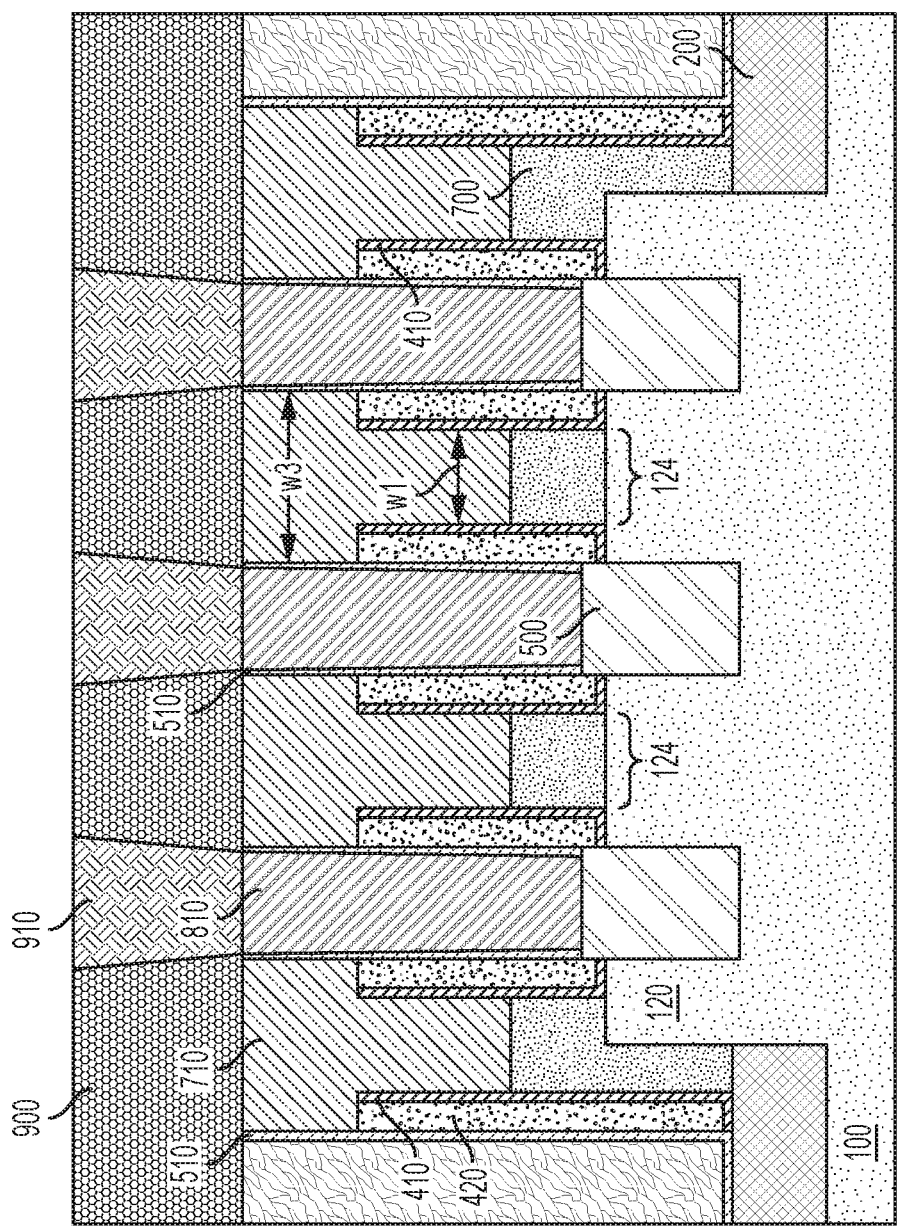
FIG. 11 shows the formation of an interlayer dielectric and metallization of the source/drain junctions.

Referring to FIG. 11, the dielectric fill layer 520 and conformal liner 510 can be removed from over source/drain junctions 500 to form self-aligned contact openings. Removal of the dielectric fill layer 520 and conformal liner 510 can be performed using an etch that is selective to the adjacent, exposed layers. For instance, the dielectric fill layer 520 and the conformal liner 510 can be removed by a reactive ion etch or isotropic etch such as a wet etch or an isotropic plasma etch. An example wet etch chemistry that can be used to remove the CESL layer 510 includes phosphoric acid.

Prior to metallization of the source/drain region, a wet etch can be used to remove native oxide from over the source/drain junctions 500. An example wet etch for stripping oxide includes hydrofluoric acid or a solution that includes dilute hydrofluoric acid (d-HF).

As shown in FIG. 11, a conductive contact 810 is formed within the contact openings and over exposed surfaces of the source/drain junctions 500 by depositing, for example, a conductive liner and a barrier layer (not separately shown) and then filling the contact openings with a contact layer such as tungsten or cobalt. The conductive liner is typically titanium and the barrier layer may be titanium nitride (TiN).

Conductive contacts 810 may include a metal that forms an ohmic contact with the source/drain junctions 500. A silicide layer (e.g., titanium silicide) may be formed in situ via reaction between the conductive liner (e.g., titanium) and the source/drain junctions 500 to form a trench silicide contact.

After formation of the conductive contacts 810, a planarization process may be used to form a structure where a top surface of a conductive contact 810 is co-planar with a top surface of the neighboring gate capping layers 710.

Additional processing may be used to form a functional device, including middle-of-the line and back-of-the line metallization and interconnect modules to form suitable electrical connections. As shown in FIG. 11, for instance, an interlayer dielectric 900 may be formed over the gate capping layers 710 and the conductive contact 810. Conventional photolithography, etching and deposition processes may be used to form metal interconnects 910 within openings in the interlayer dielectric 900 and in electrical contact with conductive contacts 810. According to further embodiments, conductive contacts 810 and metal interconnects 910 may be formed concurrently, as a single contact.

Although the foregoing methods and structures are described in connection with a FinFET device, it will be appreciated that the disclosed isolation architecture may be incorporated into various additional device structures, including planar, e.g., partially-depleted or fully-depleted SOI-based device structures.

In example planar devices, as an alternative to a conventional bulk silicon wafer platform for integrated circuit (IC) manufacture, SOI (silicon-on-insulator or semiconductor-on-insulator) substrates have been embraced by the microelectronics industry. SOI substrates are composite structures that include two semiconductor layers separated by an isolation layer. Compared to bulk silicon substrates, SOI substrates provide a number of advantages to circuit designers, including faster switching speeds, greater resistance to radiation effects, higher component packing densities, smaller leakage currents and parasitic capacitances, and the avoidance of low-impedance paths between power supply rails, i.e., "SCR latch-up."

An SOI substrate can be formed using a variety of methods such as, for example, SiMOX or bonding methods known to those skilled in the art. According to various embodiments, a wafer bonding process for manufacturing SOI wafers includes physically uniting two single crystal semiconductor wafers. For instance, one of the wafers can be thermally oxidized to form the isolation layer and, after cleaning operations, bonded to the other. Bringing two hydrophilic surfaces (such as $SiO_2$) into direct contact can result in a strong interfacial bond. Following a thermal anneal at temperatures as high as 1100° C. (e.g., 1000° C.), the bond strength can be increased to that of bulk material. The outer surface of the composite wafer can be ground and polished to the desired thickness (e.g., 1-3 microns) using, for example, chemical mechanical polishing.

A further example wafer bonding method can be performed in conjunction with a layer transfer process where, by way of example, a gallium arsenide surface to be bonded is cleaved from a source wafer of gallium arsenide. In such a process, a single crystal wafer of gallium arsenide (GaAs) is ion implanted, e.g., with hydrogen, to a desired depth to define a thin layer of gallium arsenide to be transferred. The implanted wafer is then pre-bonded to the isolation layer of a support substrate such as an oxidized silicon substrate. The pre-bonded assembly is heated to cause eruption of the hydrogen-rich plane and cleavage of the defined gallium arsenide layer from the gallium arsenide wafer. The support substrate with the transferred layer can then be heated to improve the bonding between the substrate and the transferred layer. The excess support substrate can be removed and the gallium arsenide layer polished to form an SOI structure. The gallium arsenide source wafer and the excess support substrate can each be recycled back into the process.

Figure 12:
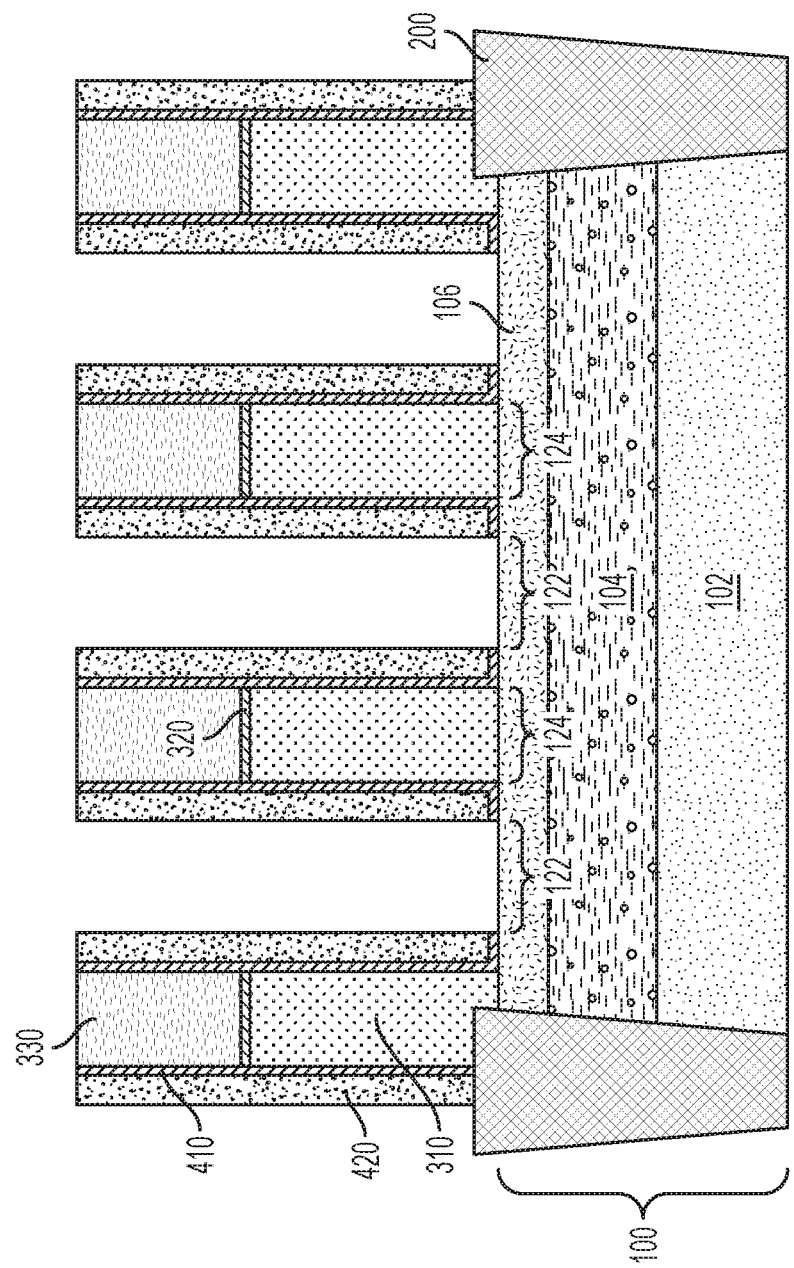
FIG. 12 is a schematic cross-sectional view of a planar device structure at an intermediate stage of fabrication, including a semiconductor substrate having alternating source/drain and channel regions, a sacrificial gate and a sacrificial gate hard mask disposed over the channel regions, and a composite spacer layer disposed over sidewalls of the sacrificial gate and the sacrificial gate hard mask.

An abbreviated process flow depicting the formation of a T-shaped capping layer in connection with a planar device is described with reference to FIGS. 12-16. Referring to FIG. 12, a device structure at an intermediate stage of fabrication includes an SOI substrate 100 having, from bottom to top, a handle portion 102, an isolation layer 104, and a semiconductor layer 106. Handle portion 102 and semiconductor layer 106 may each include a silicon-containing material such as single crystal Si, polycrystalline Si, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire sample is substantially continuous and substantially unbroken to the edges of the sample with substantially no grain boundaries.

According to various embodiments, the handle portion 102 and the semiconductor layer 106 may include the same semiconductor material or different semiconductor materials. The handle portion 102 of an example semiconductor substrate may include (100)-oriented silicon or (111)-oriented silicon, for example, and the semiconductor layer 106 may include (100)-oriented silicon, single crystal SiGe or single crystal GaAs, although other materials and material combinations are contemplated. The thickness of the semiconductor layer 106 can be 10 to 100 nm, for example, although smaller and larger values are contemplated.

The isolation layer 104 between the handle portion 102 and the semiconductor layer 106 is often referred to as a buried oxide (BOX) layer. The thickness of the isolation layer 104 may range from 30 to 300 nm, e.g., 30, 50, 100, 150, 200, 250 or 300 nm, including ranges between any of the foregoing values, although lesser and greater thicknesses may be used. The isolation layer 104 may include, for example, silicon dioxide ($SiO_2$). Alternatively, isolation layer 104 may include silicon nitride, silicon oxynitride, a low-k material, or any suitable combination of these materials.

A shallow trench isolation (STI) layer 200 may be used to provide electrical isolation between adjacent devices as is needed for the circuit(s) being formed. As illustrated, a sacrificial gate 310 is disposed over each channel region 124 of the semiconductor layer 106, a sacrificial gate oxide layer 320 is disposed over the sacrificial gate 310, and a sacrificial gate hard mask 330 is disposed over the sacrificial gate oxide layer 320. In an example method, a first spacer layer 410 is formed over sidewalls of the sacrificial gate 310, the sacrificial gate oxide layer 320, and the sacrificial gate hard mask 330, and a second spacer layer 420 is formed over sidewalls of the first spacer layer 410. The methods and materials used to form the sacrificial gate structure 310, 320, 330 as well as spacer layers 410, 420 in connection with the FinFET device illustrated in FIG. 1, may be used to form the structure illustrated in FIG. 12.

Figure 13:
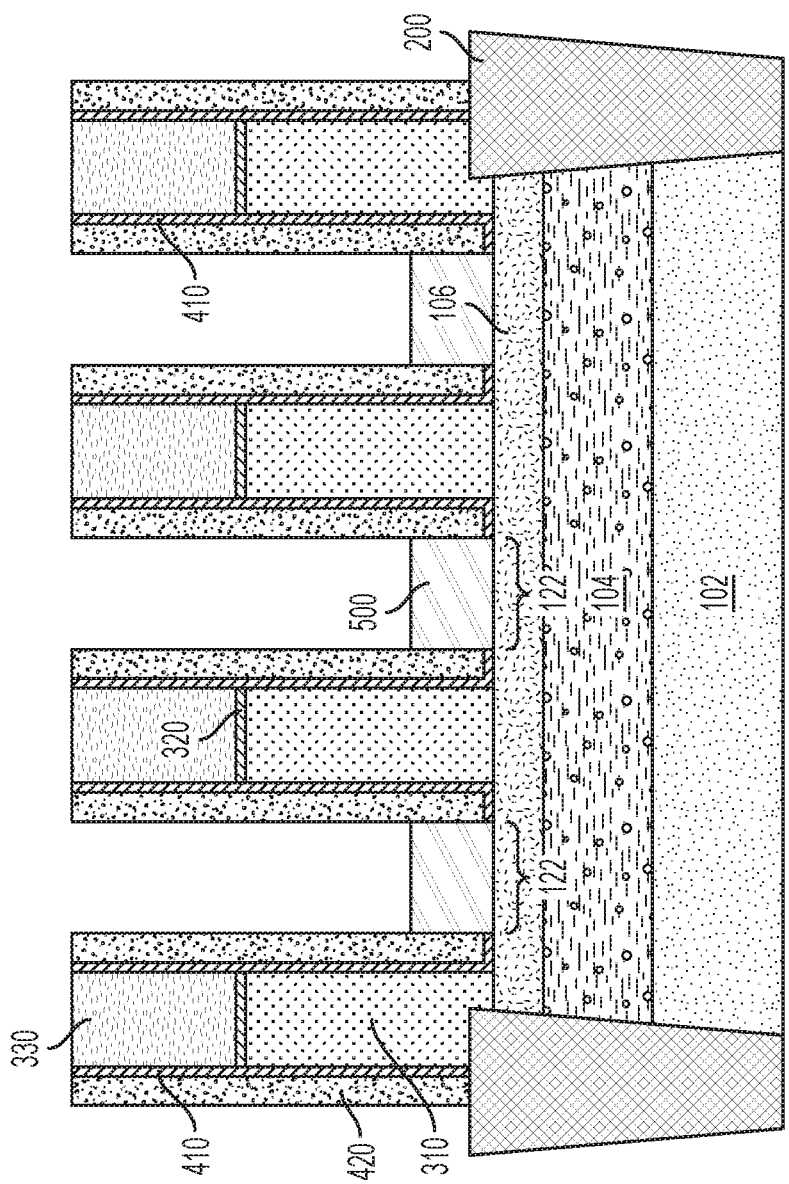
FIG. 13 shows a cross-section of the device of FIG. 12 after the formation of raised source/drain junctions over the source/drain regions of the substrate.
Figure 14:
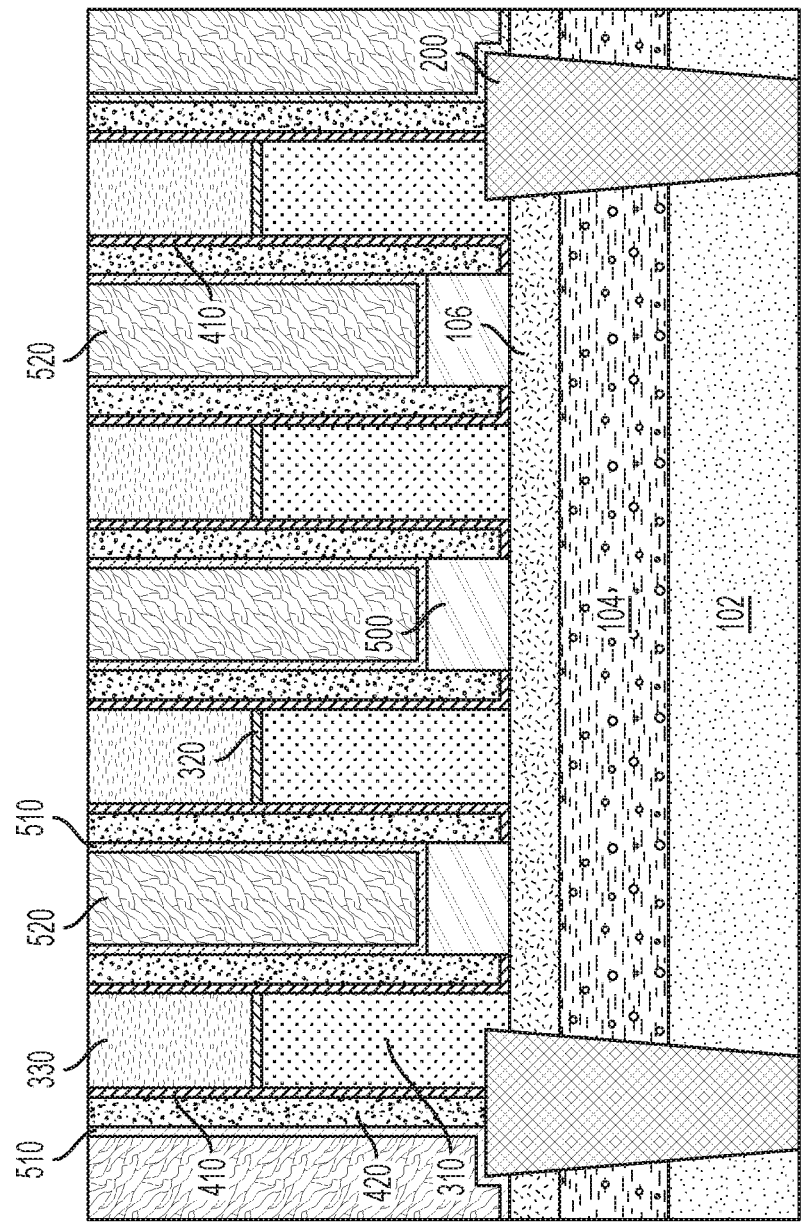
FIG. 14 depicts the formation of a conformal contact etch stop layer within contact locations over the source/drain junctions and a dielectric fill layer over the contact etch stop layer.

Referring to FIG. 13, raised source/drain junctions 500 are formed over source/drain regions 122 of semiconductor layer 106 and, as illustrated in FIG. 14, a conformal liner 510 is formed within contact locations over the source/drain junctions 500, and a dielectric fill layer 520 is formed directly over the conformal liner 510.

Figure 15:
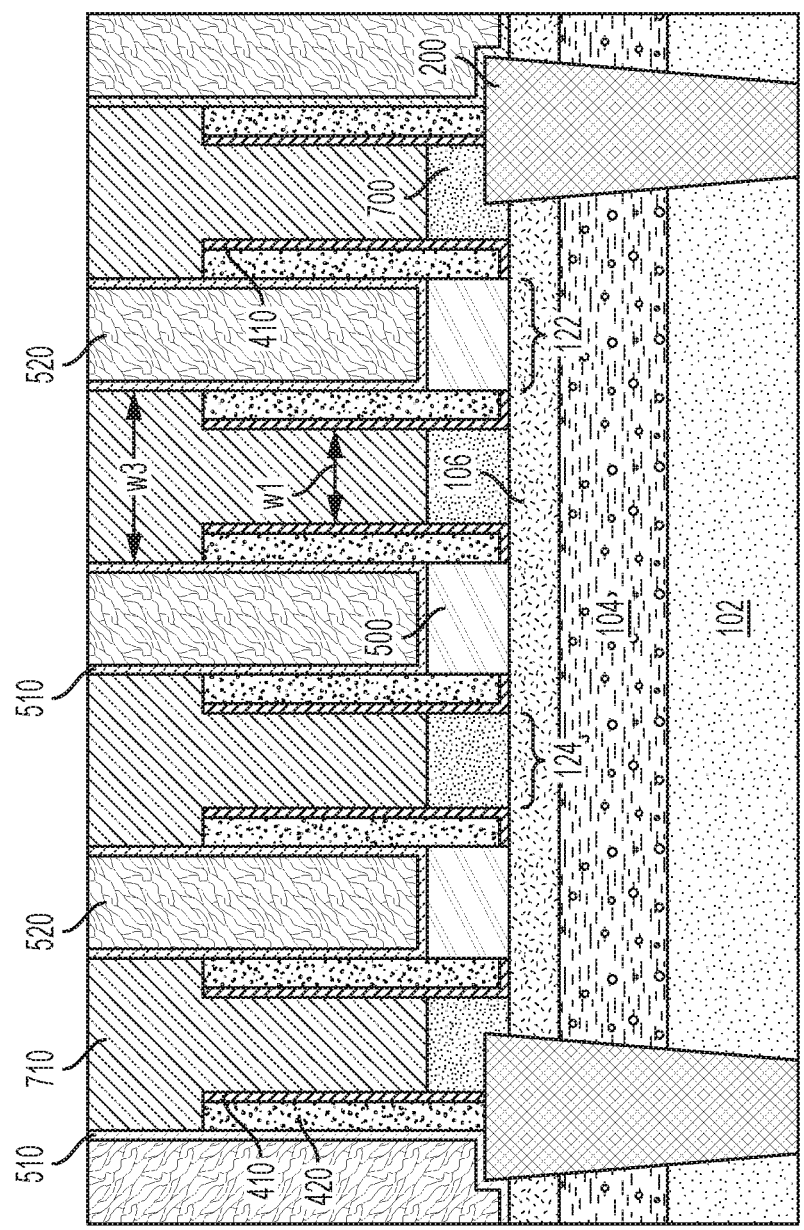
FIG. 15 depicts the planar device architecture following a replacement metal gate (RMG) module and the deposition and planarization of a self-aligned gate cap over functional gates.

As will be appreciated, according to various embodiments, the processing may continue for the planar device in the manner disclosed herein with reference to FIGS. 4-9 and, as shown in FIG. 15, include a replacement metal gate (RMG) module as described with reference to FIG. 10, including the formation of a functional gate stack 700 over channel regions 124 of the semiconductor layer 104. Gate stack 700 includes a gate dielectric layer and a gate conductor layer (not separately shown).

Figure 16:
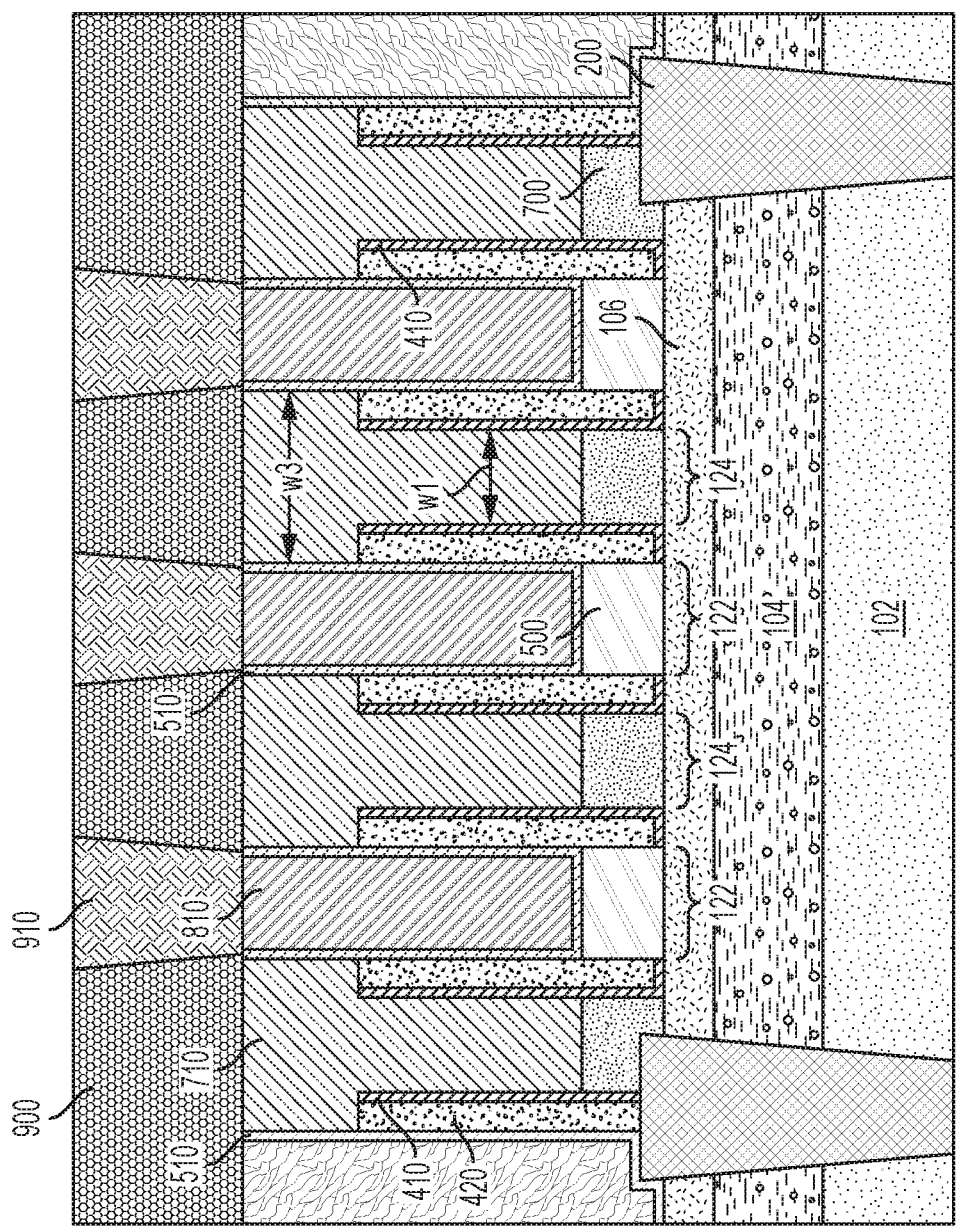
FIG. 16 shows the formation of an interlayer dielectric over the structure of FIG. 15 and metallization of the source/drain junctions.

A planar device architecture according to certain embodiments, and including a T-shaped capping layer 710 over the gate 700, is illustrated in FIG. 16 following the formation of conductive contacts 810 within contact openings and over exposed surfaces of the source/drain junctions 500. An interlayer dielectric 900 may be formed over the gate capping layers 710 and the conductive contacts 810. Conventional photolithography, etching and deposition processes may be used to form metal interconnects 910 within openings in the interlayer dielectric 900 and in electrical contact with conductive contacts 810.

As used herein, the singular forms "a," "an" and "the" include plural referents unless the context clearly dictates otherwise. Thus, for example, reference to an "etching step" includes examples having two or more such "etching steps" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a high-k spacer that comprises aluminum oxide include embodiments where a high-k spacer consists essentially of aluminum oxide and embodiments where a high-k spacer consists of aluminum oxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A semiconductor device, comprising:
    a semiconductor layer having a source/drain region and a channel region adjacent to the source/drain region;
    a conductive contact disposed over the source/drain region;
    a gate stack disposed over the channel region;

a gate cap disposed over the gate stack, wherein the gate cap has a lower portion having a first width, an upper portion having a second width greater than the first width, and the lower portion and the upper portion have substantially vertical sidewalls;

a low-k spacer layer including a low-k material disposed between the conductive contact and the lower portion of the gate cap; and an etch stop layer disposed directly between the low-k spacer layer and the conductive contact, and between the upper portion of the gate cap and the conductive contact, the etch stop layer and the low-k spacer layer comprising materials selected such that the etch stop layer and the low-k spacer layer can be etched selectively relative to each other, and wherein the etch stop layer comprises silicon nitride and the low-k spacer layer comprises carbon.

2. The semiconductor device of claim 1, wherein the gate cap is T-shaped.

3. The semiconductor device of claim 1, wherein a bottom surface of the gate cap is below a top surface of the low-k spacer layer.

4. The semiconductor device of claim 1, wherein the gate cap comprises silicon nitride and the low-k spacer layer comprises SiOC.

5. The semiconductor device of claim 1, wherein the device is a FinFET device.

6. A semiconductor device, comprising:
a semiconductor layer having a source/drain region and a channel region adjacent to the source/drain region;
a conductive contact disposed over the source/drain region;
a gate stack disposed over the channel region;
a gate cap disposed over the gate stack, wherein the gate cap has a lower portion having a first width, an upper portion having a second width greater than the first width;
a pair of low-k spacer layers each including a low-k spacer material and disposed between the conductive contact and the lower portion of the gate cap, wherein the upper portion of the gate cap contacts and overlies each of the pair of low-k spacer layers, and wherein each of the pair of low-k spacer layers includes a different spacer material; and
an etch stop layer disposed directly between one of the pair of low-k spacer layers and the conductive contact, and between the upper portion of the gate cap and the conductive contact, the etch stop layer and the one of the pair of low-k spacer layers comprising materials selected such that the etch stop layer and the one of the pair of low-k spacer layers can be etched selectively relative to each other, and wherein the etch stop layer comprises silicon nitride and both of the pair of low-k spacer layers comprise carbon.

7. The semiconductor device of claim 6, wherein the gate cap is T-shaped.

8. The semiconductor device of claim 6, wherein a bottom surface of the gate cap is below a top surface of the one of the pair of low-k spacer layers.

9. The semiconductor device of claim 6, wherein the gate cap comprises silicon nitride and one of the pair of low-k spacer layers comprises SiOC.

10. The semiconductor device of claim 6, wherein the device is a FinFET device.

11. A semiconductor device, comprising:
a semiconductor layer having a source/drain region and a channel region adjacent to the source/drain region;
a conductive contact disposed over the source/drain region; a gate stack disposed over the channel region;
a gate cap disposed over the gate stack, wherein the gate cap has a lower portion having a first width, an upper portion having a second width greater than the first width;
a low-k spacer layer including a low-k material and disposed between the lower portion of the gate cap and the conductive contact, the upper portion of the gate cap overlying the low-k spacer layer and contacting a top surface of the low-k spacer layer; and
an non-conductive etch stop layer disposed between the gate cap and the conductive contact such that the non-conductive etch stop layer lies between the upper portion of the gate cap and the conductive contact, and between the lower portion of the gate cap and the conductive contact the non-conductive etch stop layer is disposed directly between the low-k spacer layer and the conductive contact, the non-conductive etch stop layer and the low-k spacer layer comprising materials selected such that the non-conductive etch stop layer and the low-k spacer layer can be etched selectively relative to each other.

12. The semiconductor device of claim 11, wherein the low-k spacer layer is a first low-k spacer layer and the low-k material is a first low-k material, the semiconductor device further comprising a second low-k spacer layer including a second low-k material and disposed directly between the first low-k spacer layer and the conductive contact, the upper portion of the gate cap overlying the second low-k spacer layer and contacting a top surface of the second low-k spacer layer, the second low-k material being different from the first low-k material.

13. The semiconductor device of claim 12, wherein at least one of the first and second low-k materials comprise carbon.

14. The semiconductor device of claim 13, wherein any of the first and second low-k materials that comprises carbon includes SiOC or SiOCN.

15. The semiconductor device of claim 13, wherein the gate cap comprises silicon nitride.

16. The semiconductor device of claim 15, wherein the non-conductive etch stop layer comprises silicon nitride.

17. The semiconductor device of claim 16, wherein one of the first and second low-k materials includes SiOCN and the other of the first and second low-k materials includes SiOC.

18. The semiconductor device of claim 12, wherein the lower portion of the gate cap includes a bottom surface that is below a top surface of the first low-k spacer layer and a top surface of the second low-k spacer layer.

19. The semiconductor device of claim 11, wherein the lower portion of the gate cap includes a bottom surface that is below a top surface of the low-k spacer layer.

20. The semiconductor device of claim 11, wherein the non-conductive etch stop layer comprises silicon nitride and the low-k material comprises carbon.

* * * * *